(12) United States Patent
Guedes et al.

(10) Patent No.: US 9,069,031 B2
(45) Date of Patent: Jun. 30, 2015

(54) PIEZOELECTRICALLY ACTUATED MAGNETIC-FIELD SENSOR

(71) Applicant: The Regents of the University of California, Oakland, CA (US)

(72) Inventors: Andre Guedes, Berkeley, CA (US);
David Horsley, Albany, CA (US);
Gerardo Jaramillo, Davis, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 189 days.

(21) Appl. No.: 13/838,434

(22) Filed: Mar. 15, 2013

(65) Prior Publication Data

US 2013/0249545 A1 Sep. 26, 2013

Related U.S. Application Data

(60) Provisional application No. 61/613,347, filed on Mar. 20, 2012.

(51) Int. Cl.
*G01R 33/02* (2006.01)
*G01R 33/09* (2006.01)
*G01R 33/00* (2006.01)

(52) U.S. Cl.
CPC .......... *G01R 33/091* (2013.01); *G01R 33/0011* (2013.01)

(58) Field of Classification Search
CPC .... G01R 33/09; G01R 33/091; G01R 33/093; G01R 33/095; G01R 33/096; G01R 33/098; G01R 33/02; G01R 33/035; G01R 33/0354; G01R 33/0352; G01R 33/04; G01R 33/05; G01R 33/06; G01R 33/063; G01R 33/066; G01R 33/07; G01R 33/072; G01R 33/075; G01R 33/077
USPC .................. 324/246–252, 244, 260, 262, 263
See application file for complete search history.

(56) References Cited

U.S. PATENT DOCUMENTS

2012/0206134 A1* 8/2012 Fischer et al. ................ 324/244

* cited by examiner

*Primary Examiner* — Tung X Nguyen
*Assistant Examiner* — Son Le
(74) *Attorney, Agent, or Firm* — Park, Vaughan, Fleming & Dowler LLP; Steven E. Stupp

(57) ABSTRACT

A magnetic-field sensor that provides an output signal in response to an external magnetic field is described. This magnetic-field sensor includes a pair of cantilevers separated by a horizontal gap, which is displaced vertically over an open cavity by applying a time-varying voltage having a fundamental frequency across piezoelectric layers in the pair of cantilevers. The pair of cantilevers also includes magnetic-flux concentrators that convey the external magnetic field to the horizontal gap between the pair of cantilevers. A stationary magnetoresistive sensor in the horizontal gap transforms the external magnetic field into an output signal. Because the pair of cantilevers is displaced vertically at the fundamental frequency, the output signal includes a modulation signal corresponding to the external magnetic field centered around twice the fundamental frequency. This modulation of the external magnetic field allows 1/f noise to be suppressed, thereby improving the sensitivity of the magnetic-field sensor.

20 Claims, 5 Drawing Sheets

PIEZOELECTRICALLY ACTUATED MAGNETIC-FIELD SENSOR

CROSS REFERENCE TO RELATED APPLICATION

This application claims priority under 35 U.S.C. §119(e) to U.S. Provisional Application Ser. No. 61/613,347, entitled "Magnetic Sensor Having Piezoelectrically-Actuated Flux Concentrator," by David Horsley, André Guedes, and Gerardo Jaramillo, Attorney Docket Number UC11-004-1PSP, filed on Mar. 20, 2012, the contents of which are herein incorporated by reference.

BACKGROUND

1. Field

The present disclosure generally relates to a magnetic-field sensor. More specifically, the present disclosure relates to a magnetic-field sensor with a piezoelectrically actuated magnetic-flux concentrator.

2. Related Art

Current low magnetic-field detection techniques are inadequate for the needs of many applications. For example, while superconducting quantum interference devices (SQUIDs) can measure magnetic fields in the picotesla range, these devices are based on superconductivity, a phase of matter that presently only exists at extremely low temperatures. As a consequence, SQUIDs currently require cryogenic refrigeration in order to operate. This requirement significantly increases the size, power consumption and expense of SQUIDs, which can make these devices poorly suited for applications, such as medical diagnostics, remote sensing or portable applications.

Hence, what is needed is a magnetic-field sensor without the problems described above.

SUMMARY

One embodiment of the present disclosure provides a magnetic-field sensor that provides an output signal (such as a voltage signal) in response to an external magnetic field. This magnetic-field sensor includes a substrate having a surface, where the substrate includes an open cavity defined by an edge on the surface. Moreover, the magnetic-field sensor includes a pair of cantilevers, separated by a gap, disposed over the open cavity. A given cantilever includes a bottom electrode, a piezoelectric layer disposed on the bottom electrode, and a magnetic-flux concentrator disposed on the piezoelectric layer. The magnetic-flux concentrator conveys the external magnetic field to the gap. Furthermore, the magnetic-field sensor includes a magnetoresistive sensor, disposed in the gap, which provides the output signal in response to the external magnetic field. Additionally, the magnetic-field sensor includes connectors that apply voltages having a fundamental frequency across the piezoelectric layers in the pair of cantilevers. Note that, in response to the applied voltages, the pair of cantilevers is displaced, at the fundamental frequency, relative to the magnetoresistive sensor along a direction perpendicular to the surface (i.e., out-of-plane displacement).

In some embodiments, the given cantilever includes a structural layer (such as a passive structural layer) to ensure displacement along the direction during piezoelectric actuation. Moreover, the magnetoresistive sensor may be supported on a bridge in the gap.

The magnetic-flux concentrators may include a soft magnetic material (such as a soft ferromagnetic material). In particular, the given cantilever has a length and a width, and the magnetic-flux concentrator in the given cantilever may include a magnetic material having a first coercivity along the width of the given cantilever and a second coercivity along the length of the given cantilever, where the first coercivity is greater than the second coercivity (i.e., the easy axis of the soft magnetic material is along the width).

In some embodiments, the voltages applied to the pair of cantilevers are in-phase with each other.

Moreover, the magnetoresistive sensor may include a spin valve. However, a wide variety of magnetic-field sensors may be used, including: a Hall effect sensor, a fluxgate magnetometer, a superconducting quantum interference device, a magneto-optical sensor, a magnetic tunnel junction, a magnetoresistive sensor based on an anisotropic magnetoresistive effect, etc.

In some embodiments, the magnetic-field sensor includes an optional current source that drives a current through the magnetoresistive sensor.

Note that the displacement of the pair of cantilevers at the fundamental frequency may modulate the output signal so that there is a modulation signal corresponding to (i.e., may be a function of) the external magnetic field centered around twice the fundamental frequency. Furthermore, the magnetic-field sensor may include an optional electrical circuit that measures the output signal, where the electrical circuit demodulates the modulation signal. Alternatively or additionally, the optional electrical circuit may include a filter having a pass band that includes twice the fundamental frequency.

In some embodiments, the magnetic-field sensor includes an optional housing surrounding the open cavity, the pair of cantilevers and the magnetoresistive sensor, where a pressure within the optional housing is less than atmospheric pressure.

Additionally, the magnetic-field sensor may include an optional driver circuit that provides the voltages. Note that the fundamental frequency may approximately equal a resonant frequency of the given cantilever.

Another embodiment provides a magnetic-field sensor with two instances of the aforementioned magnetic-field sensor (which are sometimes referred to as 'modulation sensors'). These modulation sensors may include pairs of cantilevers disposed over at least one open cavity in the substrate. Moreover, the magnetic-field sensor may provide the output signal based on the measurement signals from the magnetoresistive sensors in the two instances of the modulation sensor. For example, the output signal may correspond to (i.e., may be a function of) a difference between the measurement signals.

Another embodiment provides a method for providing the output signal in response to the external magnetic field. During this method, the external magnetic field is conveyed using magnetic-flux concentrators in the pair of cantilevers to the gap between the pair of cantilevers, where the given cantilever includes the structural layer, the bottom electrode, the piezoelectric layer disposed on the bottom electrode, and one of the magnetic-flux concentrators, and where the pair of cantilevers is disposed over the open cavity having the edge defined in the surface of the substrate. Then, the voltage having the fundamental frequency is applied across the piezoelectric layers in the pair of cantilevers in order to displace the pair of cantilevers, at the fundamental frequency, relative to the magnetoresistive sensor disposed in the gap and in the direction perpendicular to the surface. Next, the external magnetic field is transformed into the output signal using the magnetoresistive sensor.

Another embodiment provides a system that includes an instance of one of the aforementioned embodiments of the magnetic-field sensor.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a magnetic-field sensor, a system that includes the magnetic-field sensor and a method for providing an output signal in response to an external magnetic field are described. This magnetic-field sensor includes a pair of cantilevers separated by a horizontal gap, which is displaced vertically over an open cavity by applying a time-varying voltage having a fundamental frequency across piezoelectric layers in the pair of cantilevers. The pair of cantilevers also includes magnetic-flux concentrators that convey the external magnetic field to the horizontal gap between the pair of cantilevers. A magnetoresistive sensor on a stationary bridge in the horizontal gap between the cantilevers transforms the external magnetic field into an output signal. Because the pair of cantilevers is displaced vertically at the fundamental frequency, the output signal includes a modulation signal corresponding to the external magnetic field centered around twice the fundamental frequency. This modulation of the external magnetic field to a higher frequency allows 1/f noise to be suppressed, thereby improving the sensitivity of the magnetic-field sensor.

The magnetic-field sensor may be used in a wide variety of existing and novel low magnetic-field measurement applications.

Figure 1:
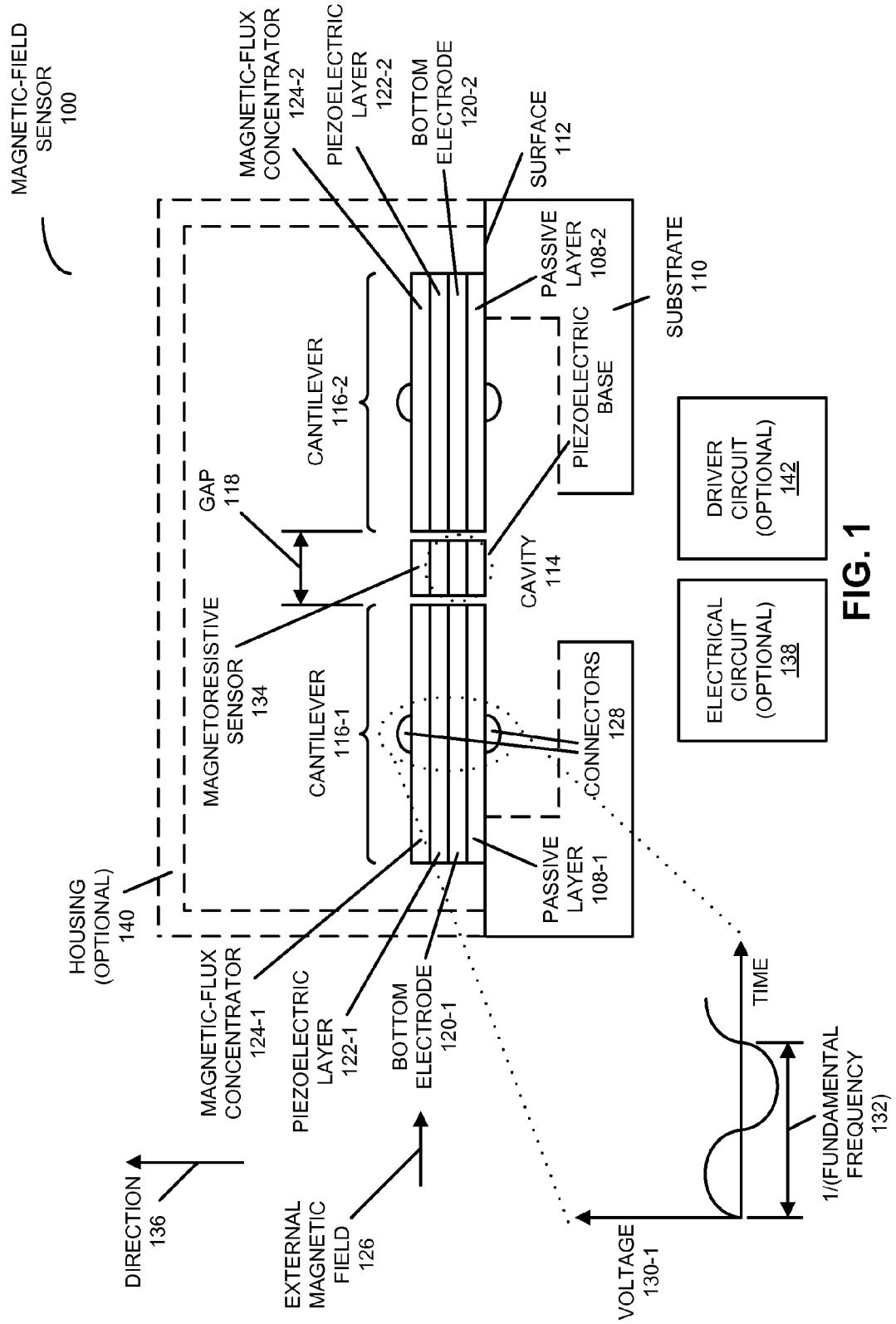
FIG. 1 is a block diagram illustrating a side view of a magnetic-field sensor in accordance with an embodiment of the present disclosure.

We now describe embodiments of the magnetic-field sensor. FIG. 1 presents a block diagram illustrating a side view of a magnetic-field sensor 100 (which is sometimes referred to as a 'modulation sensor') that provides an output signal 210-1 (FIG. 2) (such as a voltage signal) in response to an external magnetic field 126. This magnetic-field sensor includes a substrate 110 having a surface 112, where substrate 110 includes an open cavity 114 defined by an edge 212 (FIG. 2) on surface 112. Moreover, magnetic-field sensor 100 includes at least a pair of cantilevers 116 (and, more generally, a piezoelectric resonator, such as a microelectromechanical-system resonator), separated by a gap 118, disposed over open cavity 114. A given cantilever, such as cantilever 116-1, includes: a structural or passive layer 108-1, a bottom electrode 120-1, a piezoelectric layer 122-1 disposed on bottom electrode 120-1, and an (integrated) magnetic-flux concentrator 124-1 disposed on piezoelectric layer 122-1. Magnetic-flux concentrator 124-1 conveys external magnetic field 126 to gap 118.

Furthermore, magnetic-field sensor 100 includes connectors (such as connectors 128) that apply time-varying voltages having a fundamental frequency 132 across piezoelectric layers 122 in the pair of cantilevers 116 (such as voltage 130-1 across connectors 128). For example, bottom electrodes 120 may be grounded and magnetic-flux concentrators 124 may be driven with the voltages. (Note that using magnetic-flux concentrators 124 as the top electrode may result in a more compact device that is easier to fabricate.) In some embodiments, the voltages applied to pair of cantilevers 116 are in-phase with each other. However, in other embodiments the voltages are out-of-phase with each other (for example, 180° out-of-phase). Note that magnetic-field sensor 100 may include an optional driver circuit 142 that provides the voltages.

In response to the applied voltages, the pair of cantilevers 116 is displaced, at fundamental frequency 132 and along a direction 136 perpendicular to surface 112, relative to at least one stationary magnetoresistive sensor (or element) 134 in gap 118. This magnetoresistive sensor is disposed on a bridge, such as the piezoelectric base shown in FIG. 1, which may hold magnetoresistive sensor 134 stationary while cantilevers 116 are displaced along direction 136 during piezoelectric actuation. Note that fundamental frequency 132 may approximately equal a resonant frequency of the given cantilever so that the sensitivity of magnetic-field sensor 100 is maximized. For example, fundamental frequency 132 may be within 5% of the resonant frequency.

Figure 2:
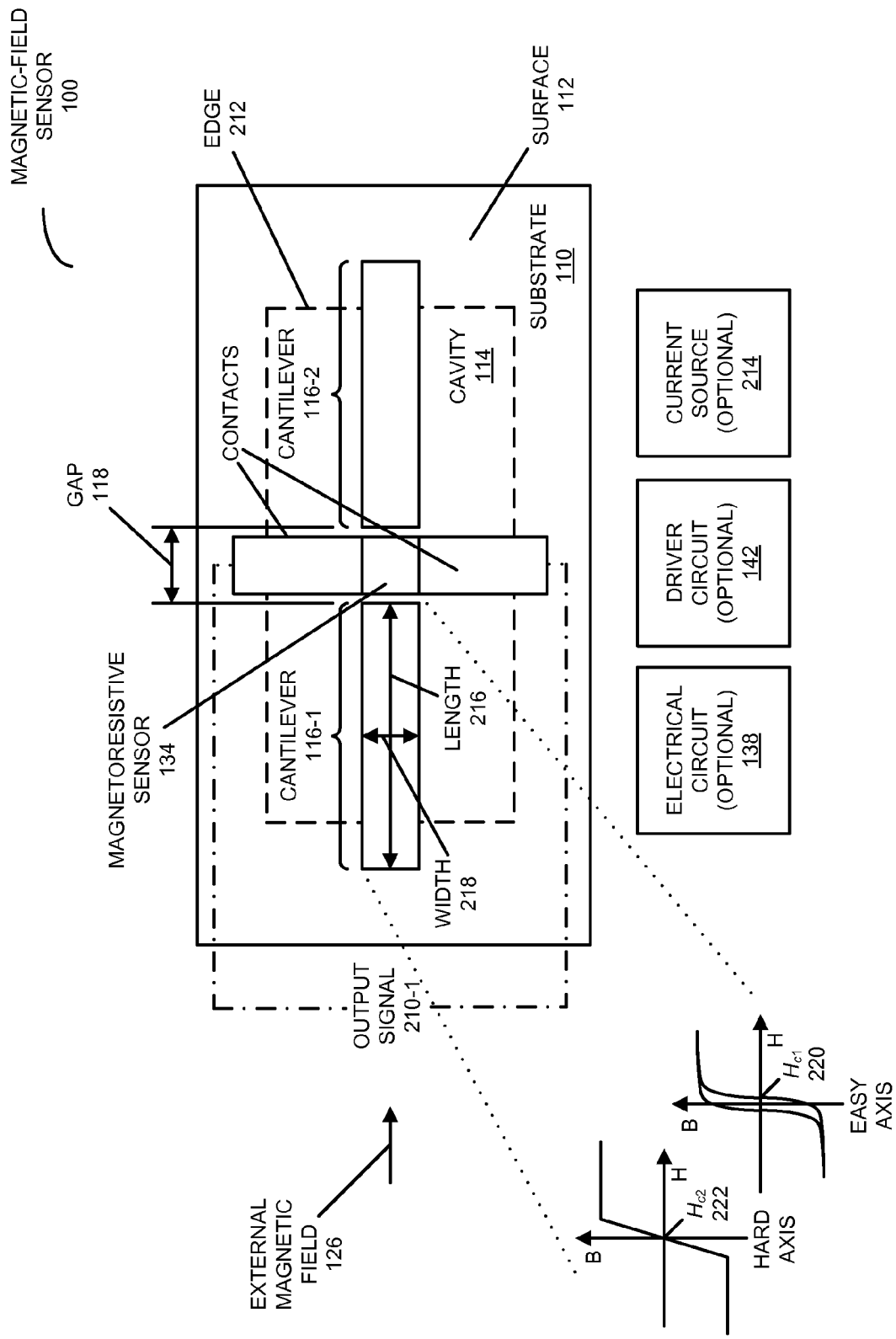
FIG. 2 is a block diagram illustrating a top view of the magnetic-field sensor of FIG. 1 in accordance with an embodiment of the present disclosure.

As shown in FIG. 2, which presents a block diagram illustrating a top view of magnetic-field sensor 100, magnetoresistive sensor 134 provides output signal 210-1 in response to external magnetic field 126 and the displacement of the pair of cantilevers 116. In an exemplary embodiment, magnetoresistive sensor 134 includes a spin valve, such as: a substrate, 2.0 nm of tantalum, 2.5 nm of nickel iron, 2.5 nm of cobalt iron, 2.2 nm of copper, 2.5 nm of cobalt iron, 6 nm of manganese iridium, and 2.0 nm of tantalum. (More generally, the magnetic-field sensor may include: a Hall effect sensor, a fluxgate magnetometer, a superconducting quantum interference device, a magneto-optical sensor, a magnetic tunnel junction, a magnetoresistive sensor based on an anisotropic magnetoresistive effect, etc.) In some embodiments, magnetic-field sensor 100 includes an optional current source 214 (and, more generally, an optional sense circuit, which may include a voltage source) that drives a current through magnetoresistive sensor 134 so external magnetic field 126 is transformed into output signal 210-1. As noted previously, magnetoresistive sensor 134 may be disposed on a stationary base, which may hold magnetoresistive sensor 134 stationary while cantilevers 116 displace along direction 136 during piezoelectric actuation.

Magnetic-flux concentrators 124 may include a soft magnetic material (such as a ferromagnetic material), such as a compound with 93% cobalt, 3% zirconia and 4% niobium (i.e., $Co_{93}Zr_3Nb_4$). In particular, the given cantilever has a length 216 and a width 218, and magnetic-flux concentrator 124-1 in the given cantilever may include a magnetic material having a coercivity ($H_{c1}$) 220 along width 218 of the given cantilever and a coercivity ($H_{c2}$) 222 (which may be near zero) along length 216 of the given cantilever, where coercivity 220 is greater than coercivity 222 (i.e., the easy axis is along width 218 and the hard axis is along length 216).

Referring back to FIG. 1, the displacement of the pair of cantilevers 116 at fundamental frequency 132 may modulate output signal 210-1 (FIG. 2) so that there is a modulation signal corresponding to (i.e., may be a function of) external magnetic field 126 centered around twice fundamental frequency 132. (This is described further below with reference to FIG. 3) Furthermore, magnetic-field sensor 100 may include an optional electrical circuit 138 that measures output signal 210-1 (FIG. 2), where electrical circuit 138 demodulates the modulation signal. Alternatively or additionally, optional electrical circuit 138 may include a filter having a pass band that includes twice fundamental frequency 132. By modulating external magnetic field 126 at twice the resonance frequency of cantilevers 116, the low-frequency magnetic-field spectrum of magnetoresistive sensor 134 may be modulated above the 1/f noise knee, so that the 1/f noise can be suppressed or filtered out. In this way, the sensitivity of magnetic-field sensor 100 may only be limited by the thermal background noise. In some embodiments, optional electrical circuit 138 includes an integrator or an averaging circuit.

In some embodiments, magnetic-field sensor 100 includes an optional housing 140 surrounding open cavity 114, the pair of cantilevers 116 and magnetoresistive sensor 134, where a pressure within optional housing 140 is less than atmospheric pressure.

As shown in FIG. 2, in an exemplary embodiment, length 216 is 400 µm, width 218 is 38-40 µm, magnetoresistive sensor 134 has a width of 1.3-1.5 µm and a length of 40-42 µm, the stationary bridge (such as piezoelectric base) in gap 118 has a width of 3.5 µm, piezoelectric layers 122 optionally extend a distance of 0.5 µm beyond magnetic-flux concentrators 124 into gap 118, and gap 118 is 2-4 µm (however, smaller gaps such as 0.5 µm may improve the efficiency of the modulation, thereby allowing smaller amplitudes of the applied voltages). Furthermore, the given cantilever may have a thickness of 2.5 µm. In particular, bottom electrodes 120 may include a 0.1 µm thick molybdenum or platinum layer on a 1.5-3.0 µm thick silicon passive layer 108, piezoelectric layers 122 may include a 0.7-1.0 µm thick aluminum nitride layer, and magnetic-flux concentrators 124 may be 0.2-0.5 µm thick.

Using this geometry, the given cantilever may have a resonant frequency of 10-40 kHz with a Q of approximately 100, and a peak-to-peak displacement of up to 16 µm in response to amplitude of the applied voltages up to 1.4 Vrms (in general, amplitudes up to 10 V may be used). Note that the dimensions of the cantilevers (i.e., the thickness, length and width) may be tuned in order to achieve higher resonant frequencies (such as greater than 100 kHz). As described further below with reference to FIG. 3, magnetic-field sensor 100 may be capable of measuring static or low-frequency magnetic fields having magnetic-field amplitudes in the range of picoTesla. The modulation efficiency of magnetic-field sensor 100, which quantifies the amount of external magnetic field 126 converted to high frequency (i.e., the amount of the external magnetic field modulated at high frequency divided by the external magnetic field), is estimated to be as large as 50% with the proposed design. Furthermore, magnetic-field sensor 100 may be fabricated at low cost, with a power consumption of less than 1 mW and a size of approximately 2 mm$^2$.

During operation of magnetic-field sensor 100, piezoelectric layers 122 may be driven by the applied voltages having fundamental frequency 132 approximately equal to the resonance frequency. This actuation results in vertical motion of the pair of cantilevers 116 at the resonance frequency. Because, at rest, the pair of cantilevers 116 is in-plane with magnetoresistive sensor 134, for every cantilever motion cycle (up-center-down), there are two cycles of magnetic field (low field-high field-low field). Thus, for a cantilever driven at the resonance frequency, the magnetic field emanating from magnetic-flux concentrators 124 is varied at twice the resonance frequency on magnetoresistive sensor 134. This time-varying magnetic field results in a signal at twice the resonance frequency in output signal 210-1 (FIG. 2). As an analogy, view the magnetic field or flux emanating from magnetic-flux concentrators 124 like the beam of a flashlight. This 'beam' moves over magnetoresistive sensor 134 two times per period of oscillation, thereby varying the resistance of magnetoresistive sensor 134 at twice the resonance frequency.

Figure 3:
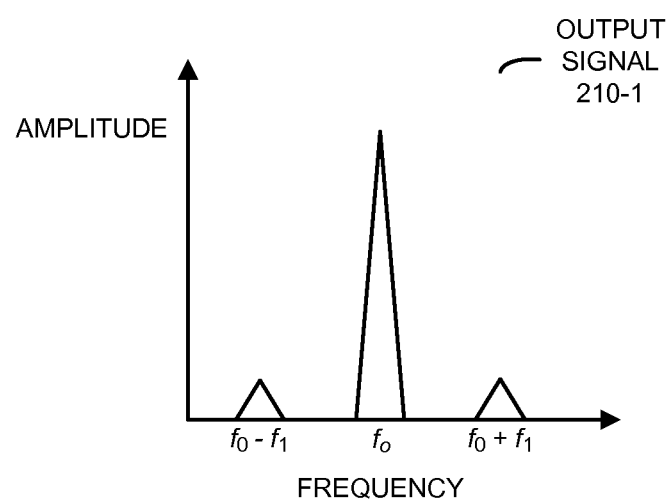
FIG. 3 is a drawing illustrating an output signal from the magnetic-field sensor in FIGS. 1 and 2 in accordance with an embodiment of the present disclosure.

When an external low-frequency (or static) magnetic field having a fundamental frequency $f_1$ is present (for example, an external magnetic field that is within the pass band of the filter in optional electrical circuit 138), the modulated magnetic field provided by magnetic-flux concentrators 124 at twice the resonance frequency of the cantilevers (A) is amplitude modulated. Therefore, output signal 210-1 (FIG. 2) may include a modulation signal centered around twice the resonant frequency of the cantilevers, i.e., sidebands at $2f_0 \pm f_1$. This is shown in FIG. 3, which presents a drawing illustrating output signal 210-1. Note that, if $f_0$ is 17.7 kHz, a low-frequency magnetic field having an amplitude of 0.3 mT and $f_1$ of 30 Hz can be detected using a spectrum analyzer at 35.4 kHz±30 Hz. Furthermore, note that the modulation efficiency is a direct function of the displacement of the cantilevers. Therefore, the larger the displacement of the cantilevers, the larger the field modulation efficiency and the overall performance/sensitivity of the magnetic-field sensor.

Figure 4:
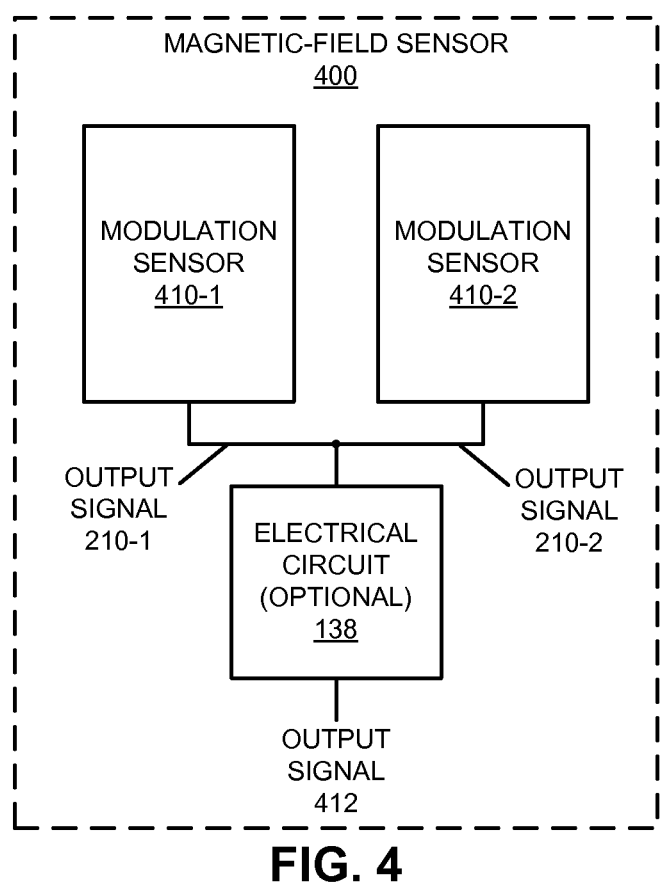
FIG. 4 is a block diagram illustrating a top view of a magnetic-field sensor in accordance with an embodiment of the present disclosure.

In some embodiments, the magnetic-field sensor includes multiple instances of the modulation sensor. This is shown in FIG. 4, which presents a block diagram illustrating a top view of a magnetic-field sensor 400. In particular, there may be two modulation sensors 410, each of which is an instance of magnetic-field sensor 100 (FIGS. 1 and 2). These modulation sensors may include pairs of cantilevers disposed over at least one open cavity in the substrate (such as open cavity 114 in substrate 110 in FIG. 1). Moreover, magnetic-field sensor 400 may provide an output signal 412 based on the output signals 210 (which are sometimes referred to as 'measurement signals') from the magnetoresistive sensors in modulation sensors 410. For example, output signal 412 may correspond to (i.e., may be a function of) a difference of output signals 210. By taking the difference of output signals 210, magnetic-field sensor 400 may be able to subtract out an ambient external magnetic field (such as the average magnetic field of the earth or the average magnetic field of an individual).

We now describe techniques for fabricating the magnetic-field sensor. The magnetoresistive sensor may be patterned and passivated on a silicon-on-insulator wafer. This may involve: depositing an $SiO_2$ seed layer; sputtering the magnetoresistive sensor; defining the magnetoresistive-sensor geometry using an ion-milling etch; defining the magnetoresistive sensor contacts (such as 200 nm thick aluminum) using photolithography; and depositing an $SiO_2$ passivation layer (such as an $SiO_2$ layer with a thickness of 0.1 µm). During sputtering of the magnetoresistive sensor, a magnetic field of 40 Oe may be applied to define the easy axis.

Then, the bottom electrode (such as molybdenum or platinum) and the piezoelectric layer (such as aluminum nitride) are deposited. For example, the molybdenum may have a thickness of 0.1 µm and the aluminum nitride layer may have a thickness of 0.7 µm.

Moreover, the magnetic-flux concentrator is deposited (such as $Co_{93}Zr_3Nb_4$) and defined by etching on top of the piezoelectric layer. During the deposition of the magnetic-flux concentrator, a magnetic field of 80 Oe may be applied. Next, an SiO$_2$ mask is defined for a cantilever-structure etch, and the pair of cantilevers is defined by etching through all of the layers in the cantilevers, including: the piezoelectric layer, the bottom electrode, and the underlying silicon passive layer. Finally, the open cavity is defined using a backside release, such as deep reactive ion etching of the silicon substrate.

The magnetic-field sensor may be used in a wide variety of applications, including: magnetocardiography (MCG), magnetoencephalography (MEG), other medical applications, bionics, remote (far-distance) and non-destructive characterization of electric components, ultra-low magnetic field detection, space applications, geographic and oil exploration, failure analysis, crack detection, welding quality assessment, etc.

One of the aforementioned embodiments of the magnetic-field sensor may be included in a system. This system may include, but is not limited to: a server, a laptop computer, a communication device or system, a media player, a personal or a desktop computer, a tablet, a cellular telephone (such as a smartphone), an appliance, a subnotebook/netbook, a work station, a mainframe computer, a blade, an enterprise computer, a data center, a portable computing device, a supercomputer, a network-attached-storage (NAS) system, a storage-area-network (SAN) system, a piece of testing equipment, a network appliance, a set-top box, a personal digital assistant (PDA), a toy, a controller, a digital signal processor, a game console, a computational engine within an appliance, a consumer-electronic device, a portable computing device, a personal organizer, and/or another electronic computing device. Moreover, note that this system may be at one location or may be distributed over multiple, geographically dispersed locations.

The preceding embodiments may include fewer components or additional components. For example, while the magnetic-field sensor is illustrated using a pair of piezoelectric cantilevers, more generally a wide variety of piezoelectric resonators (such as microelectromechanical-system resonators) having different geometries may be used. Although these embodiments are illustrated as having a number of discrete items, these embodiments are intended to be functional descriptions of the various features that may be present rather than structural schematics of the embodiments described herein. Consequently, in these embodiments two or more components may be combined into a single component, and/or a position of one or more components may be changed.

Note that the magnetic-field sensor may be fabricated using an additive or positive process (i.e., a material-deposition process) and/or a subtractive or negative process (i.e., a material-removal process). For example, the process may include: sputtering, plating, isotropic etching, anisotropic etching, a photolithographic technique and/or a direct-write technique. Additionally, these processes may utilize a wide variety of materials, including: a semiconductor, metal, glass, sapphire, an organic material, a ceramic material, a plastic and/or silicon dioxide. Note that substrate 110 may include silicon or a material other than silicon. Therefore, in some embodiments substrate 110 includes a material such as: glass, silicon, a ceramic, and/or a plastic (for example, substrate 110 may be fabricated using injection-molded plastic).

Figure 5:
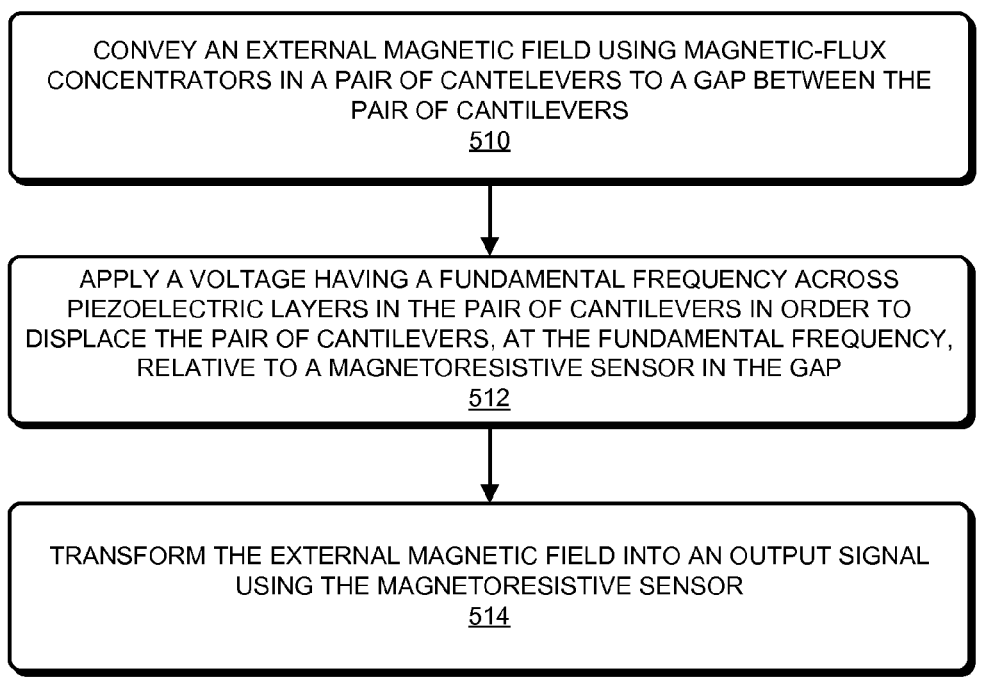
FIG. 5 is a flow diagram illustrating a method for providing an output signal in response to an external magnetic field in accordance with an embodiment of the present disclosure.

We now describe embodiments of the method. FIG. 5 presents a flow diagram illustrating a method 500 for providing an output signal in response to an external magnetic field, which may be performed using magnetic-field sensors 100 (FIGS. 1 and 2) and/or 400 (FIG. 4). During this method, the external magnetic field is conveyed using magnetic-flux concentrators in a pair of cantilevers to a gap between the pair of cantilevers (operation 510), where a given cantilever includes a structural layer, a bottom electrode, a piezoelectric layer disposed on the bottom electrode, and one of the magnetic-flux concentrators, and where the pair of cantilevers is disposed over an open cavity having an edge defined in a surface of a substrate. Then, a voltage having a fundamental frequency is applied across the piezoelectric layers in the pair of cantilevers in order to displace the pair of cantilevers, at the fundamental frequency, relative to a magnetoresistive sensor disposed in the gap (operation 512) and along a direction perpendicular to the surface. Next, the external magnetic field is transformed into an output signal using the magnetoresistive sensor (operation 514).

In some embodiments of method 500, there are additional or fewer operations. Moreover, the order of the operations may be changed, and/or two or more operations may be combined into a single operation. For example, instead of a continuous applied voltage in operation 512, a voltage transient or pulse may be used. This may reduce the power consumption of the magnetic-field sensor.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A magnetic-field sensor configured to provide an output signal in response to an external magnetic field, comprising:
    a substrate having a surface, wherein the substrate includes a cavity defined by an edge on the surface;
    a pair of cantilevers, separated by a gap, disposed over the cavity, wherein a given cantilever includes a structural layer, a bottom electrode, a piezoelectric layer disposed on the bottom electrode, and a magnetic-flux concentrator disposed on the piezoelectric layer, and wherein the magnetic-flux concentrator is configured to convey the external magnetic field to the gap;
    a magnetoresistive sensor, disposed in the gap, configured to provide the output signal in response to the external magnetic field; and
    connectors electrically coupled to the bottom electrodes and the magnetic-flux concentrators in the pair of cantilevers, wherein the connectors are configured to apply voltages having a fundamental frequency across the piezoelectric layers in the pair of cantilevers; and
    wherein, in response to the applied voltages, the pair of cantilevers is configured to displace, at the fundamental frequency, relative to the magnetoresistive sensor along a direction perpendicular to the surface.

2. The magnetic-field sensor of claim 1, wherein the given cantilever has a length and a width;

wherein the magnetic-flux concentrator in the given cantilever includes a magnetic material having a first coercivity along the width of the given cantilever and a second coercivity along the length of the given cantilever; and wherein the first coercivity is greater than the second coercivity.

3. The magnetic-field sensor of claim 1, wherein the voltages applied to the pair of cantilevers is in-phase with each other.

4. The magnetic-field sensor of claim 1, wherein the magnetoresistive sensor includes a spin valve.

5. The magnetic-field sensor of claim 1, wherein the magnetic-field sensor further comprises a current source, electrically coupled to the magnetoresistive sensor, configured to drive a current through the magnetoresistive sensor.

6. The magnetic-field sensor of claim 1, wherein the displacement of the pair of cantilevers at the fundamental frequency modulates the output signal so that there is a modulation signal corresponding to the external magnetic field centered around twice the fundamental frequency.

7. The magnetic-field sensor of claim 6, wherein the magnetic-field sensor further comprises an electrical circuit configured to measure the output signal; and wherein the electrical circuit is configured to demodulate the modulation signal.

8. The magnetic-field sensor of claim 1, wherein the magnetic-field sensor further comprises an electrical circuit configured to measure the output signal.

9. The magnetic-field sensor of claim 8, wherein the electrical circuit includes a filter having a pass band that includes twice the fundamental frequency.

10. The magnetic-field sensor of claim 1, wherein the magnetic-field sensor further comprises a housing surrounding the cavity, the pair of cantilevers and the magnetoresistive sensor; and wherein a pressure within the housing is less than atmospheric pressure.

11. The magnetic-field sensor of claim 1, wherein the magnetic-field sensor further comprises a driver circuit configured to provide the voltages.

12. The magnetic-field sensor of claim 11, wherein the fundamental frequency approximately equals a resonant frequency of the given cantilever.

13. A magnetic-field sensor configured to provide an output signal in response to an external magnetic field, comprising:
  a substrate having a surface, wherein the substrate includes at least one cavity defined by an edge on the surface; and
  two instances of a modulation sensor, wherein a given modulation sensor includes:
    a pair of cantilevers, separated by a gap, disposed over the cavity, wherein a given cantilever includes a structural layer, a bottom electrode, a piezoelectric layer disposed on the bottom electrode, and a magnetic-flux concentrator disposed on the piezoelectric layer, and wherein the magnetic-flux concentrator is configured to guide the external magnetic field to the gap;
    a magnetoresistive sensor, disposed in the gap, configured to provide the output signal in response to the external magnetic field; and
    connectors electrically coupled to the bottom electrodes and the magnetic-flux concentrators in the pair of cantilevers, wherein the connectors are configured to apply voltages having a fundamental frequency across the piezoelectric layers in the pair of cantilevers;
    wherein, in response to the applied voltages, the pair of cantilevers is configured to displace, at the fundamental frequency, relative to the magnetoresistive sensor along a direction perpendicular to the surface; and
    wherein the magnetic-field sensor is configured to provide the output signal based on the measurement signals from the magnetoresistive sensors in the two instances of the modulation sensor.

14. The magnetic-field sensor of claim 13, wherein the output signal corresponds to a difference of the measurement signals.

15. The magnetic-field sensor of claim 13, wherein the given cantilever has a length and a width;
  wherein the magnetic-flux concentrator in the given cantilever includes a magnetic material having a first coercivity along the width of the given cantilever and a second coercivity along the length of the given cantilever; and
  wherein the first coercivity is greater than the second coercivity.

16. The magnetic-field sensor of claim 13, wherein the magnetic-field sensor further comprises a current source, electrically coupled to the magnetoresistive sensors, configured to drive a current through the magnetoresistive sensors.

17. The magnetic-field sensor of claim 13, wherein the displacement of the pair of cantilevers at the fundamental frequency modulates the measurement signal so that there is a modulation signal corresponding to the external magnetic field centered around twice the fundamental frequency.

18. The magnetic-field sensor of claim 17, wherein the magnetic-field sensor further comprises an electrical circuit configured to measure the output signal; and
  wherein the electrical circuit is configured to demodulate the modulation signal.

19. The magnetic-field sensor of claim 18, wherein the electrical circuit includes a filter having a pass band that includes twice the fundamental frequency.

20. A method for providing an output signal in response to an external magnetic field, wherein the method comprises:
  conveying the external magnetic field using magnetic-flux concentrators in a pair of cantilevers to a gap between the pair of cantilevers, wherein a given cantilever includes a structural layer, a bottom electrode, a piezoelectric layer disposed on the bottom electrode, and one of the magnetic-flux concentrators, and wherein the pair of cantilevers is disposed over a cavity having an edge defined in a surface of a substrate;
  applying a voltage having a fundamental frequency across the piezoelectric layers in the pair of cantilevers in order to displace the pair of cantilevers, at the fundamental frequency, relative to a magnetoresistive sensor disposed in the gap and along a direction perpendicular to the surface; and
  transforming the external magnetic field into an output signal using the magnetoresistive sensor.

* * * * *